US012765290B2

(12) United States Patent
Samira

(10) Patent No.: US 12,765,290 B2
(45) **Date of Patent: *Oct. 13, 2026**

(54) METHOD OF PLASMA ETCHING

(71) Applicant: SPTS Technologies Limited, Newport (GB)

(72) Inventor: Binte Kazemi Samira, Newport (GB)

(73) Assignee: SPTS Technologies Limited, Newport (GB)

( * ) Notice: Subject to any disclaimer, the term of this patent is extended or adjusted under 35 U.S.C. 154(b) by 143 days.

This patent is subject to a terminal disclaimer.

(21) Appl. No.: 18/375,009

(22) Filed: Sep. 29, 2023

(65) Prior Publication Data

US 2024/0213030 A1 Jun. 27, 2024

(30) Foreign Application Priority Data

Dec. 22, 2022 (GB) ..................................... 2219567

(51) Int. Cl.

| | |
|---|---|
| ***H10P 50/24*** | (2026.01) |
| ***H01J 37/32*** | (2006.01) |
| ***H10P 50/00*** | (2026.01) |
| ***H10P 72/00*** | (2026.01) |

(52) U.S. Cl.

CPC ...... *H10P 50/242* (2026.01); *H01J 37/32449* (2013.01); *H10P 50/692* (2026.01); *H10P 72/0421* (2026.01); *H01J 2237/3341* (2013.01)

(58) Field of Classification Search

None

See application file for complete search history.

(56) References Cited

U.S. PATENT DOCUMENTS

| | | | | |
|---|---|---|---|---|
| 9,484,216 | B1 * | 11/2016 | Bauer | H10N 30/082 |
| 2012/0003827 | A1 * | 1/2012 | Xu | H01L 21/32136 438/591 |
| 2018/0130883 | A1 * | 5/2018 | Hardy | H01L 21/3081 |
| 2023/0170188 | A1 * | 6/2023 | Wood | H01J 37/32449 216/41 |
| 2023/0197457 | A1 * | 6/2023 | Wood | H01L 21/76862 438/9 |

FOREIGN PATENT DOCUMENTS

| | | |
|---|---|---|
| EP | 4192220 A1 | 6/2023 |

OTHER PUBLICATIONS

Zhao et al., "A 5.3 GHz Al0.76Sc0.24N Two-Dimensional Resonant Rods Resonator with a Record kt2 of 23.9%," Cornell University Library, Feb. 23, 2022.

(Continued)

*Primary Examiner* — Shamim Ahmed

(74) *Attorney, Agent, or Firm* — Hodgson Russ LLP

(57) ABSTRACT

An additive-containing aluminium nitride film is plasma etched. The additive-containing aluminium nitride film contains an additive element selected from scandium (Sc), yttrium (Y) or erbium (Er). A plasma is established within the chamber to plasma etch the additive-containing aluminium nitride film exposed within the trench. A ratio of the inert diluent gas flow rate to the sum of the $BCl_3$ and $Cl_2$ flow rates is in the range 0.45:1 to 0.75:1 and a ratio of the $BCl_3$ flow rate to the $Cl_2$ flow rate is in the range 0.75:1 to 1.25:1.

18 Claims, 5 Drawing Sheets

(56) References Cited

OTHER PUBLICATIONS

EPO, Extended European Search Report issued for European Patent Application No. 23193297.1, Apr. 23, 2024.
Wang et al., "Research of etching process of Al0.8Sc0.2N based on ICP etching equipment," 2021 Electron Devices Technology and Manufacturing Conference (EDTM), 2021, pp. 1-3.
Esteves et al., "Al0.68Sc0.32N Lamb wave resonators with electromechanical coupling coefficients near 10.28%," Applied Physics Letters, 2021, pp. 171902-1-171902-5, vol. 118, No. 17.
UK IPO, Search Report for UK Application No. 2219567.1, Dec. 20, 2023.
Petrich et al., "Investigation of ScAlN for piezoelectric and ferroelectric applications," 2019 22nd European Microelectronics and Packaging Conference & Exhibition (EMPC), IMAPS—Europe, Sep. 16, 2019.
Shao et al., "High Figure-of-Merit Lamb Wave Resonators Based on Al0.7Sc0.3N Thin Film," IEEE Electron Device Letters, Sep. 9, 2021, pp. 1378-1381, vol. 42, No. 9.
Luo et al., "Optimization of AlN and AlScN Film ICP Etching," IEEE MEMS 2021, Virtual Conference, Jan. 25, 2021, pp. 638-641.
EPO, Partial European Search Report issued for EP Application No. 23193297.1, Jan. 31, 2024.
IPO, Search Report for GB App. No. 2219567.1, Jun. 20, 2023.
Hardy et al., Epitaxial ScAlN Etch-Stop Layers Grown by Molecular Beam Epitaxy for Selective Etching of AlN and GaN, IEEE Trans on Semi Mfg, Nov. 2017, vol. 30, No. 4, 475-479.
Colombo et al., Investigation of 20% Scandium-doped Aluminum Nitride Films for MEMS Laterally Vibrating Resonators, IEEE, 2017, 1-4.

* cited by examiner (a) (b) (c) (d)

(a)

(b)

(c)

(d)

METHOD OF PLASMA ETCHING

CROSS-REFERENCE TO RELATED APPLICATIONS

This application claims priority to the UK Patent Application No. 2219567.1 filed Dec. 22, 2022, the disclosure of which is hereby incorporated by reference.

FIELD OF THE DISCLOSURE

This invention relates to a method of plasma etching, with particular reference to a method of plasma etching an additive-containing aluminium nitride film, the additive-containing aluminium nitride film containing an additive element selected from scandium (Sc), yttrium (Y) or erbium (Er). The invention relates also to an associated apparatus for plasma etching an additive-containing aluminium nitride film of this kind.

BACKGROUND OF THE DISCLOSURE

Aluminium nitride (AlN) and aluminium scandium nitride (AlScN) piezoelectric devices are widely used in a range of RF technologies such as bulk acoustic wave (BAW) devices, piezoelectric micromachined ultrasonic transducers (PMUTs), lamb wave contour mode resonators (CMR), microphones and sensors. Mobile phones typically incorporate a number of AlN and AlScN BAW devices and the generation of higher operating frequencies require the use of thinner BAW devices. Improving the piezoelectric performance for thinner devices is a major challenge as tolerances become tighter and the integration of these devices on circuit boards becomes more complicated. The addition of Sc is known to improve the piezoelectric properties of BAW devices. However, there are a number of problems associated with the etching of AlScN which are particularly troublesome with high scandium contents.

As the percentage of Sc in doped AlN increases, the etch rate typically decreases when using standard chlorine ($Cl_2$)/argon (Ar) based chemistries. This decrease results in a lower AlScN selectivity to masks (such as photoresist or $SiO_2$ masks), which increases the critical dimension (CD) and consequently results in a shallower sidewall angle within the AlScN trenches. Common methods of controlling the sidewall profile include adjusting the slope of the pre-etch mask, changing the platen bias, etchant gas flow or process pressure. These methods are commonly effective for lower Sc content AlScN, but at higher Sc percentages the etch becomes increasingly physical, decreasing the overall effectiveness of these methods. Similar effects are observed with AlYN and AlErN films.

The decrease in AlScN etch rate also reduces the selectivity to metal underlayers, leading to increased underlayer loss which can impair the performance of some devices, such as BAW filters. The lower electrical contact to BAW devices is typically molybdenum (Mo), tungsten (W) or platinum (Pt) and if excessive amounts of metal are removed, owing to the reduced etch rate of AlScN, the electrical resistance of the contact will increase, resulting in a degradation of device performance. Typical changes to increase the AlScN etch rate, such as increased platen bias or increased $Cl_2$ flow, may ultimately have little-to-no impact on the sidewall angle or underlayer selectivity, or in some cases may even exacerbate the issue.

AlScN etch processes typically comprise two etch steps. The first step is a main, bulk etch process with a high etch rate, good selectivity to the mask material, a steep sidewall profile, and minimum footing. Normally 80-85% of the material is etched by the main etch. The second step is a soft-landing etch step which should have good selectivity to the underlying electrode. This is generally a low etch rate process. As this process typically etches only 15-20% of the material, the etch rate and the etch profile can be sacrificed for good selectivity.

For the avoidance of doubt, footing refers to an undesirable deviation away from an ideal flat bottom surface at the base of an etched feature. This is typically measured using SEM cross sections of etched features. Footing is caused by a difference in the etch rate between the region close to the mask and the region far from the mask, at the base of the etched feature. FIG. 2 shows the production of etch features with and without footing. More specifically, FIG. 2(*a*) shows a workpiece prior to etching. The workpiece comprises a silicon wafer 200 having a layer 201 of AlScN deposited thereon. A mask 202 is formed on the AlScN layer 201 to leave an opening 203 through which the AlScN layer can be etched. FIG. 2(*b*) shows the workpiece after etching of the AlScN layer 201 to produce a trench 204 which has a flat bottomed base with no footing. FIG. 2(*c*) shows the workpiece after etching of the AlScN layer 201 to produce a trench 205 which exhibits footing in the form of a concave base profile.

BRIEF SUMMARY OF THE DISCLOSURE

The present invention, in at least some of its embodiments, seeks to address at least some of the above-mentioned problems.

According to a first aspect of the invention there is provided a method of plasma etching an additive-containing aluminium nitride film, the additive-containing aluminium nitride film containing an additive element selected from scandium (Sc), yttrium (Y) or erbium (Er), the method comprising the steps of:

- placing a workpiece upon a substrate support within a plasma chamber, the workpiece comprising a substrate having an additive-containing aluminium nitride film deposited thereon and a mask disposed upon the additive-containing aluminium nitride film which defines at least one trench;
- introducing $BCl_3$ gas into the chamber with a $BCl_3$ flow rate in sccm;
- introducing $Cl_2$ gas into the chamber with a $Cl_2$ flow rate in sccm;
- introducing an inert diluent gas into the chamber with an inert diluent gas flow rate in sccm; and
- establishing a plasma within the chamber to plasma etch the additive-containing aluminium nitride film exposed within the trench;
- wherein a ratio of the inert diluent gas flow rate to the sum of the $BCl_3$ and $Cl_2$ flow rates is in the range 0.45:1 to 0.75:1 and a ratio of the $BCl_3$ flow rate to the $Cl_2$ flow rate is in the range 0.75:1 to 1.25:1.

In this way, the problem of footing can be reduced.

The ratio of the inert diluent gas flow rate to the sum of the $BCl_3$ and $Cl_2$ flow rates can be in the range 0.48:1 to 0.6:1.

The ratio of the $BCl_3$ flow rate to the $Cl_2$ flow rate can be in the range 0.9:1 to 1.1:1, optionally in the range 0.95:1 to 1.05:1, optionally about 1.0:1.

The $BCl_3$ flow rate and the $Cl_2$ flow rate can be each in the range 20 to 30 sccm, optionally about 25 sccm.

The inert diluent gas flow rate can be in the range 20 to 30 sccm, optionally about 25 sccm.

The plasma etch can be performed with a gas pressure in the chamber of no greater than 5 m Torr.

An inductively coupled plasma (ICP) can be established within the chamber using a power in the range 750 to 1500 W.

An RF bias signal having a power in the range 1000 to 1500 W can be applied to the substrate support during the step of establishing a plasma within the chamber.

The method of the first aspect of the invention can be performed as a first, main, plasma etching step to etch a majority of the additive-containing aluminium nitride film exposed within the trench, and then followed by a second plasma etching step to etch the remaining additive-containing aluminium nitride film exposed within the trench. The second aspect of the invention describes a second plasma etching step which can be used in conjunction with the first aspect of the invention. In principle, the first aspect of the invention does not require a second plasma etching step of this kind to be performed.

According to a second aspect of the invention there is provided a method of plasma etching an additive-containing aluminium nitride film, the additive-containing aluminium nitride film containing an additive element selected from scandium (Sc), yttrium (Y) or erbium (Er), the method comprising the steps of:

- placing a workpiece upon a substrate support within a plasma chamber, the workpiece comprising a substrate having a metal film disposed thereon, an additive-containing aluminium nitride film deposited on the metal film and a mask disposed upon the additive-containing aluminium nitride film which defines at least one trench;
- performing a first, main, plasma etching step in which $BCl_3$ gas, $Cl_2$ gas and an inert diluent gas are introduced into the chamber and a plasma is established within the chamber to plasma etch a majority of the additive-containing aluminium nitride film exposed within the trench; and
- performing a second plasma etching step in which $BCl_3$ gas and an inert diluent gas are introduced into the chamber but $Cl_2$ gas is not introduced into the chamber and a plasma is established within the chamber to plasma etch the remaining additive-containing aluminium nitride film exposed within the trench thereby revealing the metal film.

In this way, improved selectivity to metal underlayers can be achieved. Selectivity can be defined as the etch rate of the additive-containing aluminium nitride film/the etch rate of the metal film.

The $BCl_3$ gas can be introduced into the chamber with a $BCl_3$ flow rate in the range 50 to 100 sccm, optionally in the range 75 to 95 sccm, during the step of performing a second plasma etching step.

The inert diluent gas can be introduced into the chamber with an inert diluent gas flow rate in the range 10 to 20 sccm during the second plasma etching step.

In the second plasma etching step an inductively coupled plasma (ICP) can be established within the chamber using a power in the range 400 to 700 W.

An RF bias signal having a power in the range 500 to 700 W can be applied to the substrate support during the second plasma etching step.

The metal film can be a molybdenum film. Alternatively, the metal film can be a tungsten, ruthenium or platinum film.

The first plasma etching step and/or the second plasma etching step can be performed with a gas pressure in the chamber of no greater than 5 mTorr.

The first aspect of the invention can be used as the first plasma etching step.

The inert diluent gas can be Argon. Other inert gases, such as other Noble gases, can be contemplated.

The substrate can be a semiconductor substrate, optionally a silicon substrate such as a silicon wafer. The silicon wafer can be of any suitable diameter, such as 150 mm or 200 mm diameter.

The additive-containing aluminium nitride film can be an aluminium scandium nitride film defined by the formula $Al_xSc_yN$, where x+y=1. For the avoidance of doubt, the metal contents x and y in this formula are atomic contents. It will be appreciated that the At % of Al is 100× and the At % of Sc is 100y. The scandium content y can be 0.30 or more. The scandium content y can be 0.35 or more, optionally about 0.4. The scandium content y can be 0.50 or less, optionally 0.45 or less. All aspects of the invention are particularly effective in the etching of AlScN films of high Sc content.

The mask can be a photoresist mask. The mask can be a silicon oxide mask.

The plasma can be an inductively coupled plasma (ICP).

According to a third aspect of the invention there is provided an apparatus for plasma etching an additive-containing aluminium nitride film containing an additive element selected from scandium (Sc), yttrium (Y) or erbium (Er) through a mask, the apparatus comprising:

- a chamber;
- a substrate support disposed within the chamber;
- a gas delivery system for introducing into the chamber $BCl_3$ gas with a $BCl_3$ flow rate in sccm, $Cl_2$ gas with a $Cl_2$ flow rate in sccm and an inert diluent gas with an inert diluent flow rate in sccm;
- a plasma generation device for sustaining a plasma within the chamber for etching a workpiece comprising a substrate having an additive-containing aluminium nitride film deposited thereon and a mask disposed upon the additive-containing aluminium nitride film which defines at least one trench; and
- a controller configured to control the apparatus to perform plasma etching to etch the additive-containing aluminium nitride film exposed within the trench, wherein the controller controls the gas delivery system to maintain a ratio of the inert diluent gas flow rate to the sum of the $BCl_3$ and $Cl_2$ flow rates in the range 0.45:1 to 0.75:1 and a ratio of the BCl3 flow rate to the $Cl_2$ flow rate in the range 0.75:1 to 1.25:1.

According to a fourth aspect of the invention there is provided an apparatus for plasma etching an additive-containing aluminium nitride film containing an additive element selected from scandium (Sc), yttrium (Y) or erbium (Er) through a mask, the apparatus comprising:

- a chamber;
- a substrate support disposed within the chamber;
- a gas delivery system for introducing into the chamber $BCl_3$ gas, $Cl_2$ gas and an inert diluent gas;
- a plasma generation device for sustaining a plasma within the chamber for etching a workpiece comprising a substrate having a metal film disposed thereon, an additive-containing aluminium nitride film deposited on the metal film and a mask disposed upon the additive-containing aluminium nitride film which defines at least one trench; and a controller configured to control the apparatus to perform a first, main, plasma etching step in which BCl3 gas, $Cl_2$ gas and an inert diluent gas are introduced into the chamber and a plasma is established within the chamber to etch a majority of the additive-containing aluminium nitride film exposed within the trench, and a second plasma etching step in which $BCl_3$ gas and an inert diluent gas are introduced into the chamber but $Cl_2$ gas is not introduced into the chamber and a plasma is established within the chamber to etch the remaining additive-containing aluminium nitride film exposed within the trench thereby revealing the metal film.

The plasma generation device can be an inductively coupled plasma (ICP) device.

For the avoidance of doubt, whenever reference is made herein to 'comprising' or 'including' and like terms, the invention is also understood to include more limiting terms such as 'consisting' and 'consisting essentially'.

Whilst the invention has been described above, it extends to any inventive combination of the features set out above, or in the following description, drawings or claims. For example, any features disclosed in relation to the one aspect of the invention can be combined with any features disclosed in relation to the any other aspect of the invention.

DESCRIPTION OF THE DRAWINGS

Embodiments of the invention will now be described, by way of example only, with reference to the accompanying drawings, in which.

DETAILED DESCRIPTION OF THE DISCLOSURE

Figure 1:
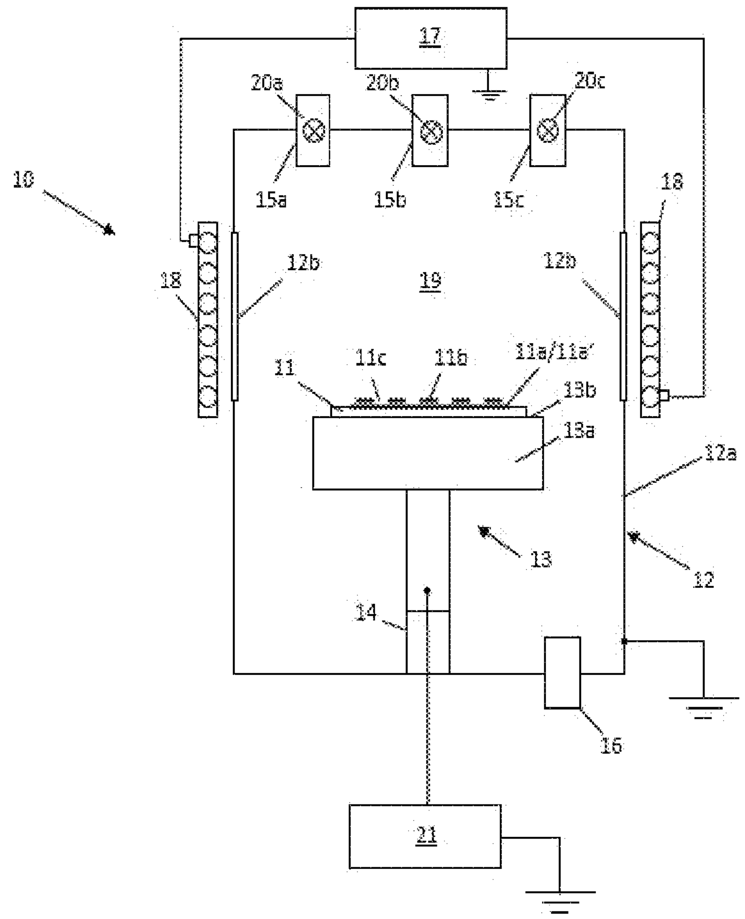
FIG. 1 is schematic illustration of a plasma etching apparatus for etching an additive-containing aluminium nitride film.

Referring to FIG. 1 of the drawings, there is provided a schematic illustration of an apparatus 1 for plasma etching a workpiece 11, and comprises a process chamber 12, within which the plasma etching of the workpiece 11 is performed.

The apparatus 10 further comprises a substrate support 13. The substrate support can be a platen assembly 13, which may also be formed of a metal, such as aluminium, disposed within the chamber 12, but which is electrically isolated from the chamber walls 12*a* by conventional means, such as ceramic breaks 14 The substrate support can also comprise an electrostatic chuck (ESC), which can be attached to the surface of the platen assembly. The platen assembly 13 comprises a body 13*a* having a support surface 13*b* for receiving the workpiece 11 and is electrically biased using a radio frequency (RF) voltage generator. The provision of a negative bias voltage to the platen assembly 13 for example, can help to control positively charged ion bombardment of the surface of the workpiece 11 from the plasma.

The process chamber 12 comprises chamber walls 12*a* which may be formed of a metal, such as aluminium for example, and which are typically electrically grounded. The chamber 12 further comprises a first, second and a third gas inlet 15*a*, 15*b*, 15*c* via which a source of BCl3 gas, $Cl_2$ gas and an inert diluent gas such as argon (not shown) respectively, can fluidly couple for introducing the gases into the chamber 12. The chamber 12 further comprises an outlet 16, via which the gases and any by-products of the etching process can pass out from the chamber 12.

In an embodiment, the plasma is an ICP plasma generated by applying an RF voltage from an RF voltage generator 17, to one or more antenna 18, which are disposed around the chamber 12 and located adjacent a respective dielectric window section 12*b* formed in the chamber walls 12*a*. The one or more antenna 18 may comprise a substantially planar spiral configuration, a helical coil configuration or a toroidal configuration, for example, and as with standard practice, impedance matching of the RF signal from the generator 17 with the antenna 18 is carried out to minimize reflection of electrical power from the antenna 18. The antennas 18 are placed around the chamber 12 and the electrical power is inductively coupled into the chamber 12, through the dielectric window sections 12*b*.

A plasma is generated in a region 19 of the chamber 12 which is disposed above the workpiece 11 so that the workpiece 11 becomes exposed to the plasma. The process gases are introduced into the chamber 12 via a respective flow regulator 20*a*, 20*b*, 20*c* coupled with the respective inlet 15*a*, 15*b*, 15*c*, and the inlet 15*a*, 15*b*, 15*c* and outlet 16 of the chamber 12 are disposed on opposite sides of the plasma region 19 so that the etching gases are required to pass through the chamber 12, via the region 19 and over the workpiece 11, in passing to the outlet 16. SPTS Technologies Ltd An example of a suitable apparatus which can be used to perform the invention is a Synapse (RTM) module produced by the applicant, SPTS Technologies Limited (Newport, UK).

Methods in accordance with the invention will be demonstrated with reference to an AlScN film, but the skilled reader will recognize that the methods are equally applicable to AlYN films and AlErN films.

The workpiece 11 is placed upon a platen 13 within the plasma chamber 12. The workpiece 11 comprises a substrate 11*a*, such as a silicon wafer substrate, upon which is deposited a piezoelectric AlScN film 11*b* using a pulsed DC sputtering technique, for example. In an embodiment, the film comprises $Al_{0.6}Sc_{0.4}N$, namely a film comprising 60% component of aluminium and a 40% component for scandium. This is a high scandium content film and it has been difficult to process films having such high scandium contents using prior art methods. The present invention provides significant improvements in the processing of high scandium content AlScN films. Film composition determination is typically achieved through the use of Energy Dispersive Analysis of X-rays (EDAX). The workpiece 11 further comprises a mask 11*b* patterned with 5 μm-100 μm trenches 11*c* formed upon the film 11*a* using either photoresist or $SiO_2$ hard masks.

With the workpiece 11 positioned upon the plate 13 within the chamber 12, $BCl_3$ $Cl_2$ and argon gases are introduced into the chamber 12 via the respective inlet 15*a-c* using the respective flow regulator 20*a-c*, and the pressure within the chamber 12 is maintained at approximately 2-5 m Torr or substantially 3 m Torr by a pressure regulator (not shown). Once the chamber 12 has been suitably conditioned with the gases, an RF potential is applied to the antenna 18, via generator 17 to inductively couple electrical power (henceforth termed the 'source power') into the etching gas, and thus initiate a plasma and commence the etching of the $Al_{0.6}Sc_{0.4}N$ film. A bias voltage carrying a bias power is also applied to the platen assembly 13, through the use of the voltage generator 21, typically operating at 13.56 MHz, to provide an etching of the AlScN film 11*b*.

Footing was reduced by controlling process parameters of the first, main, etch step. Improvements in selectivity were achieved by controlling process parameters of the second, soft-landing etch step.

Footing Reduction

Figure 2:
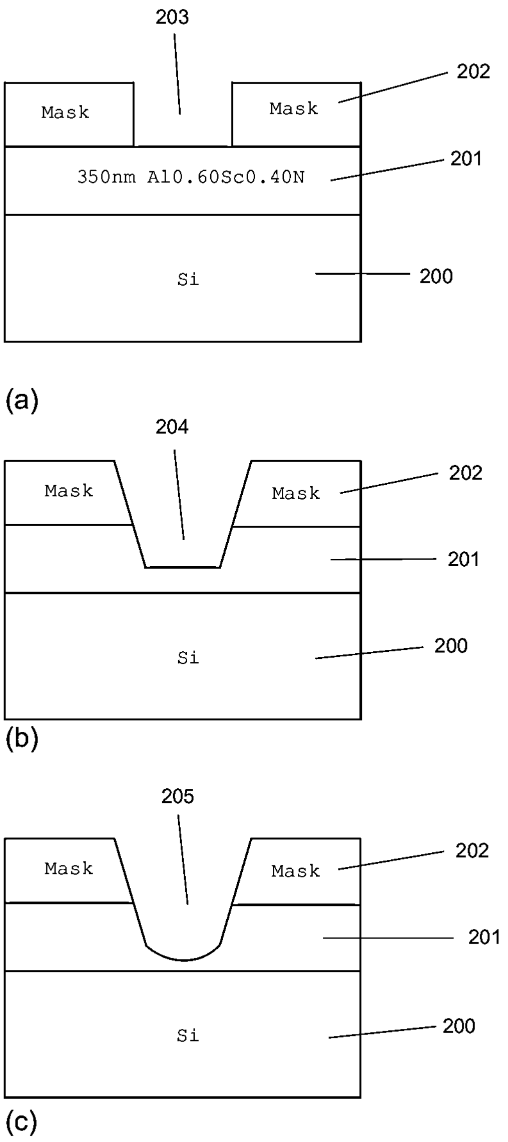
Fig. 2 (Prior Art)
FIG. 2 is a cross sectional schematic representation of a workpiece (a) prior to etching, (b) after etching and with no footing and (c) after etching and with footing present.

Etch footing was minimized by controlling the flows of the diluent, $BCl_3$ and $Cl_2$ gases. Experiments were performed using workpieces of the type generally shown in FIG. 2. More particularly, workpieces were prepared by depositing 350 nm thick $Al_{0.60}Sc_{0.40}N$ layers on silicon wafers. For these experiments, the wafers were of 150 mm diameter, but the same principles are applicable to wafers of other sizes, such as 200 mm diameter wafers. The wafers were patterned with a $SiO_2$ mask with <14% open area and a thickness between 1.7-3.5 μm. The mask profile was less than 80°. The process was performed to produce 10 μm wide trenches.

In the experiments, Ar was used as a dilutant gas and the effect of varying the Ar flow rate into the chamber was investigated. An initial increase of the Ar flow makes the plasma more uniform and minimizes footing by decreasing the loading of the plasma. The process used is physical in nature, with low pressure (2 mTorr), high bias power (1300 W) and low source power (1000 W) with flow rates of 25 sccm $Cl_2$, and 25 sccm $BCl_3$. Ar flow rates were varied from 10 sccm to 35 sccm.

Figure 3:
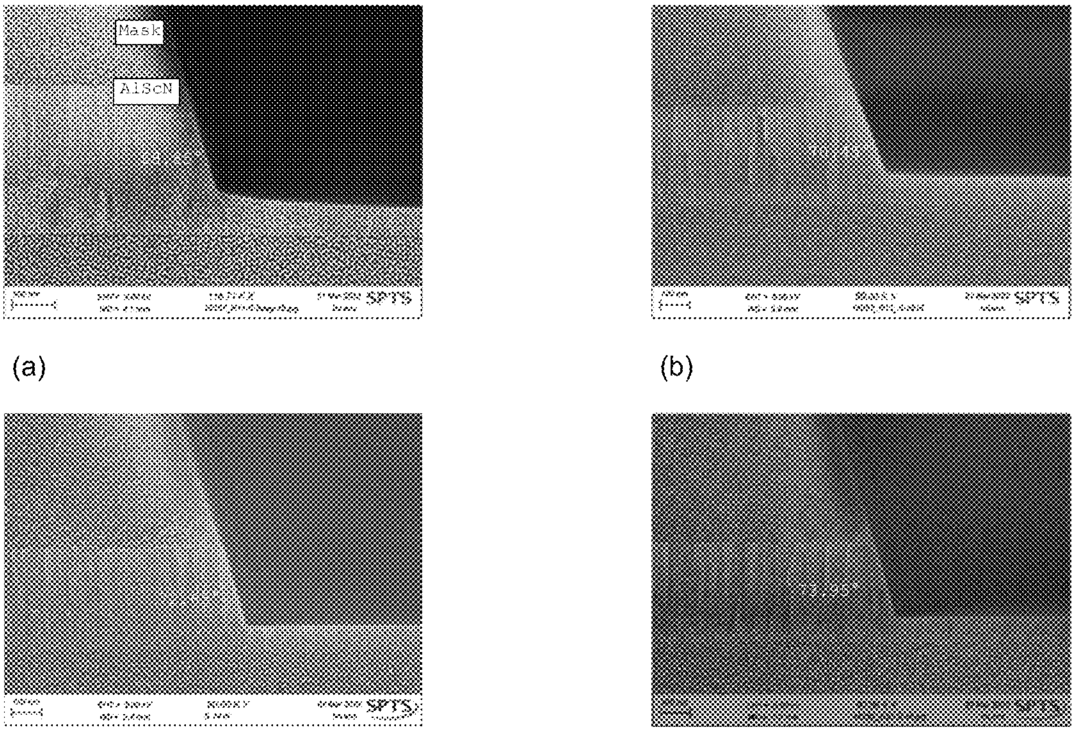
FIG. 3 shows SEM images obtaining after etching using Ar flow rates varying from 10 to 35 sccm.
Figure 4:
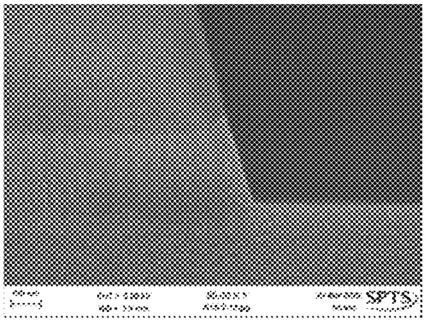
FIG. 4 shows SEM images obtaining after etching using various ratios of the $BCl_3/Cl_2$ flow rates.
Figure 4:
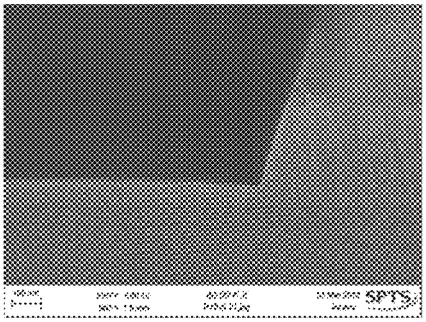
Figure 4:
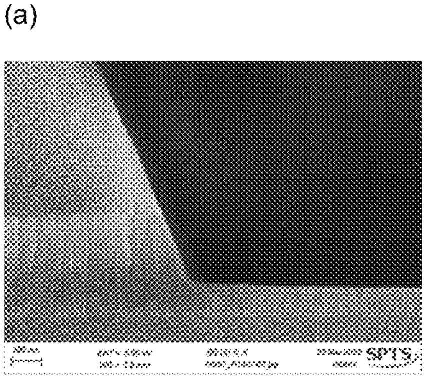
Figure 4:
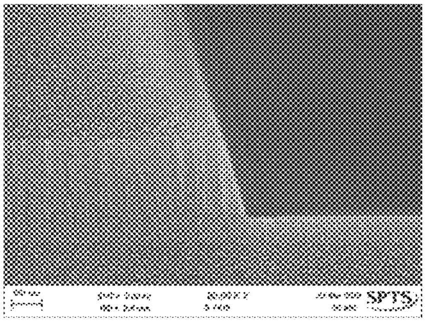

FIG. 3 shows SEM images obtaining after etching using Ar flow rates of (a) 10 sccm (b) 20 sccm (c) 25 sccm and (d) 35 sccm. It was observed that the footing decreases from 41 nm to 7 nm as the Ar flow rate increases from 10 to 25 sccm. FIGS. 4 (*a*)-(*d*) also show the sidewall angles of the etched AlScN trench. The results are summarized in Table 1. Further increases in the Ar flow rate resulted in a slight increase in footing.

Without wishing to be bound by any particular theory or conjecture, it is believed that increasing the Ar flow rate dilutes the plasma and makes it more uniform, which in turn decreases the loading effect close to the mask. Also, it is believed that Ar can assist with sputtering $ScCl_3$ based by-product.

TABLE 1

Change in footing with change in Ar flow

| Cl2/ $BCl_3$ (sccm) | Ar flow (sccm) | Footing (nm) |
|---|---|---|
| 25/25 | 10 | 41.62 |
| 25/25 | 20 | 30.72 |
| 25/25 | 25 | 7.12 |
| 25/25 | 35 | 11.33 |

Significant improvements in footing can be obtained when the argon flow is controlled in combination with the reactant gas flow.

Two main chlorine based reactant gases ($Cl_2$ and $BCl_3$) were used to etch AlScN. Using both $BCl_3$ and $Cl_2$ makes the AlScN etch profile steeper. Boron has higher sputter mass that helps with the sputtering of Sc based etch by-product from the sidewall which in turn makes the profile steeper. It has been found that there is an optimum $Cl_2$: $BCl_3$ ratio which provides a flat etch front and thereby minimizes footing. When the amount of $BCl_3$ is low, sputtering of etch by-product from the sidewall is not uniform and this results in inconsistent footing. 1:1 $BCl_3$: $Cl_2$ ratio showed minimum footing. If the ratio of $BCl_3$ is further increased, the footing increases. It is believed that extra Cl ions are available in the plasma environment, and this is believed to favor a chemical etch rather than a physical etch regime in which by-product removal by physical sputtering can take place. FIG. 4 shows SEM images obtained after etching using various ratios of the $BCl_3/Cl_2$ flow rates. FIGS. 4 (*a*) and (*b*) show the left side and right side, respectively, of a trench etched using a $BCl_3$:$Cl_2$ ratio of 0.47. FIGS. 4 (*c*) and (*d*) show results obtained using $BCl_3$:$Cl_2$ ratios of 1.0 and 2.13, respectively. The results are summarized in Table 2.

TABLE 2

Change in footing with change in ratio of the $BCl_3/Cl_2$ flow rates

| $BCl_3$ (sccm) | $Cl_2$ (sccm) | $BCl_3/Cl_2$ Ratio | Footing (nm) |
|---|---|---|---|
| 16 | 34 | 0.47 | 24.57 |
| 25 | 25 | 1 | 7.12 |
| 34 | 16 | 2.13 | 35.60 |

It is surprising that a relatively low $BCl_3$ flow rate can be beneficial when etching higher Sc content AlScN. $BCl_3$ generates less free Cl, but dissociates into B, B-Cl, B-$Cl_2$ that helps with sputtering. Therefore, higher $BCl_3$ flows would be expected to assist in the etching of higher Sc content AlScN as the etch would be expected to be more physical. It is believed that the high sputter mass of boron helps with removing etch by-product, and so an optimum $BCl_3$:$Cl_2$ ratio is needed to achieve a flat etch front.

Selectivity Improvement in the Soft-Landing Step

Figure 5:
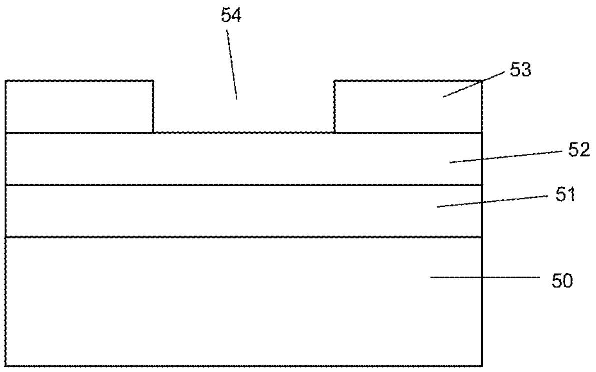
FIG. 5 is a cross sectional schematic representation of a workpiece having an underlying molybdenum film beneath a AlScN layer.

Experiments were performed using workpieces of the type generally shown in FIG. 5, which shows a workpiece comprising a silicon wafer 50 having a molybdenum layer 51 formed thereon. A layer 52 of AlScN is deposited on the molybdenum layer 51. A photoresist mask 53 is formed on the AlScN layer 52 to leave an opening 54 through which the AlScN layer can be etched. More particularly, workpieces were prepared by depositing 200 nm thick $Al_{0.60}Sc_{0.40}N$ and molybdenum layers. The layers were pattered using a 4 μm thick photoresist mask. For these experiments, the wafers were of 200 mm diameter, but the same principles are applicable to wafers of other sizes, such as 150 mm diameter wafers. This process is specifically developed for $Al_{0.60}Sc_{0.40}N$ wafers. The process conditions can be readily adapted for AlScN films of different Sc content. Selectivity to the underlying Mo layer was calculated for 5 μm and 100 μm CD trenches.

The selectivity to the underlying electrode was improved by using only $BCl_3$ as the reactant gas. Without wishing to be bound by any particular theory or conjecture, it is believed that $BCl_3$ gas generates less free Cl compared to $Cl_2$ as $BCl_3$ is absorbed into the surface of the AlScN and dissociates into $BCl_2$, BCl, Cl and B. $BCl_3$ is believed to increase the AlScN etch rate by increasing the sputtering of Sc based by-products with B but decrease the Mo etch rate due to the presence of less active Cl.

Figure 6:
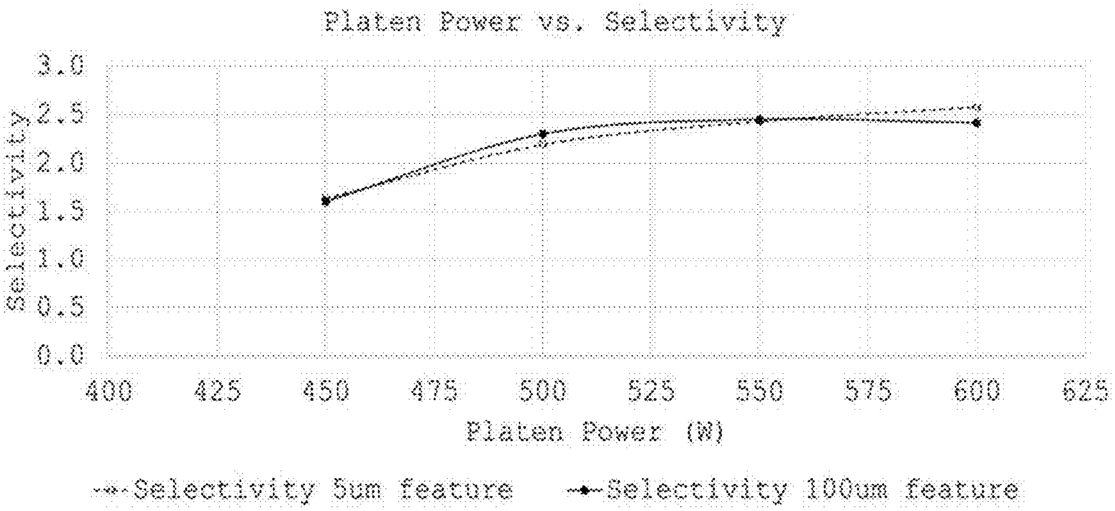
FIG. 6 shows change in selectivity with change in platen power.

The estimated selectivity that can be achieved by a $Cl_2$+$BCl_3$ based soft-landing etch is 0.97:1. It was found that changing the reactant gas to $BCl_3$ increased the selectivity to 1.6:1. Further process refinements were found to improve the selectivity further. In particular, it was found that the selectivity to the underlying Mo electrode increased with increasing platen power. Increasing platen power from 450 W to 600 W increased selectivity to Mo from 1.65 to 2.58 for 5 μm CD features. For 100 μm features selectivity increased with platen power up to 550 W. Further increases in platen power resulted in decreased selectivity. FIG. 6 shows the change in selectivity with the change in platen power. This process used very low pressure (5 mT) and low source power (500 W).

An AlScN:Mo selectivity of 2.5:1 was achieved using the process conditions shown in Table 3 for the soft landing etch. Table 3 also shows preferred conditions for the main etch.

TABLE 3

Preferred process conditions for minimized footing and high AlScN:Mo selectivity.

| Parameter | Main Etch | Soft Landing |
|---|---|---|
| Pressure (mTorr) | 2 | 3 |
| Source power (W) | 1000 | 500 |
| Platen power (W) | 1300 | 550 |
| BCl3 flow rate (sccm) | 25 | 85 |
| Cl2 flow rate (sccm) | 25 | 0 |
| Ar flow rate (sccm) | 25 | 15 |

AlScN based device performance depends on bottom electrode thickness. Controlling footing and Mo loss is more difficult for high Scandium content. The present invention can result in low electrode losses which in turn result in improved device performance in a range of applications, such as Bulk Acoustic Wave (BAW) filters for communications (including 5G), microphones, and sensors.

The invention claimed is:

1. A method of plasma etching an additive-containing aluminium nitride film, the additive-containing aluminium nitride film containing an additive element selected from scandium (Sc), yttrium (Y) or erbium (Er), the method comprising the steps of:

placing a workpiece upon a substrate support within a plasma chamber, the workpiece comprising a substrate having an additive-containing aluminium nitride film deposited thereon and a mask disposed upon the additive-containing aluminium nitride film which defines at least one trench;

introducing $BCl_3$ gas into the plasma chamber with a $BCl_3$ flow rate in sccm;

introducing $Cl_2$ gas into the plasma chamber with a $Cl_2$ flow rate in sccm;

introducing an inert diluent gas into the plasma chamber with an inert diluent gas flow rate in sccm; and establishing a plasma within the plasma chamber to plasma etch the additive-containing aluminium nitride film exposed within the trench;

wherein a ratio of the inert diluent gas flow rate to a sum of the $BCl_3$ and $Cl_2$ flow rates is in the range 0.45:1 to 0.75:1 and a ratio of the $BCl_3$ flow rate to the $Cl_2$ flow rate is in the range 0.75:1 to 1.25:1.

2. The method according to claim 1 in which the ratio of the inert diluent gas flow rate to the sum of the $BCl_3$ and $Cl_2$ flow rates is in the range 0.48:1 to 0.6:1.

3. The method according to claim 1 in which the ratio of the $BCl_3$ flow rate to the $Cl_2$ flow rate is in the range 0.9:1 to 1.1:1.

4. The method according to claim 1 in which the $BCl_3$ flow rate and the $Cl_2$ flow rate are each in the range 20 to 30 sccm.

5. The method according to claim 1 in which the inert diluent gas flow rate is in the range 20 to 30 sccm.

6. The method according to claim 1 in which the inert diluent gas is Argon.

7. The method according to claim 1, further comprising a first, main, plasma etching step to etch a majority of the additive-containing aluminium nitride film exposed within the trench, and followed by a second plasma etching step to etch the remaining additive-containing aluminium nitride film exposed within the trench.

8. A method plasma etching an additive-containing aluminium nitride film, the additive-containing aluminium nitride film containing an additive element selected from scandium (Sc), yttrium (Y) or erbium (Er), the method comprising the steps of:

placing a workpiece upon a substrate support within a plasma chamber, the workpiece comprising a substrate having a metal film disposed thereon, an additive-containing aluminium nitride film deposited on the metal film and a mask disposed upon the additive-containing aluminium nitride film which defines at least one trench;

performing a first, main, plasma etching step in which $BCl_3$ gas, $Cl_2$ gas and an inert diluent gas are introduced into the plasma chamber and a plasma is established within the plasma chamber to plasma etch a majority of the additive-containing aluminium nitride film exposed within the trench; and performing a second plasma etching step in which $BCl_3$ gas and an inert diluent gas are introduced into the plasma chamber but $Cl_2$ gas is not introduced into the plasma chamber and a plasma is established within the plasma chamber to plasma etch the remaining additive-containing aluminium nitride film exposed within the trench thereby revealing the metal film.

9. The method according to claim 8 in which the $BCl_3$ gas is introduced into the plasma chamber with a $BCl_3$ flow rate in the range 50 to 100 sccm during the step of performing a second plasma etching step.

10. The method according to claim 9 in which the $BCl_3$ gas is introduced into the plasma chamber with a $BCl_3$ flow rate in the range 75 to 95 sccm during the step of performing a second plasma etching step.

11. The method according to claim 8 in which the inert diluent gas is introduced into the plasma chamber with an inert diluent gas flow rate in the range 10 to 20 sccm during the second plasma etching step.

12. The method according to claim 8 in which an RF bias signal having a power in the range 500 to 700 W is applied to the substrate support during the second plasma etching step.

13. The method according to claim 8 in which the inert diluent gas is Argon.

14. The method according to claim 8 in which the metal film is a molybdenum film.

15. The method according to claim 8 in which the mask is a photoresist mask.

16. The method according to claim 8, in which the plasma is an inductively coupled plasma (ICP).

17. The method according to claim 8 in which substrate is a semiconductor substrate.

18. The method according to claim 8 in which the additive-containing aluminium nitride film is an aluminium scandium nitride film defined by the formula $Al_xSc_yN$, where x+y=1, and wherein the scandium content y is 0.35 or more.

* * * * *